United States Patent
Okumura et al.

(10) Patent No.: US 8,742,723 B2
(45) Date of Patent: Jun. 3, 2014

(54) BATTERY PACK ASSEMBLED WITH RECYCLED BATTERIES AND METHOD OF ASSEMBLY

(75) Inventors: Motoyoshi Okumura, Chiryu (JP); Katsunori Maegawa, Toyohashi (JP)

(73) Assignee: Panasonic EV Energy Co., Ltd., Kosai-Shi (JP)

( * ) Notice: Subject to any disclaimer, the term of this patent is extended or adjusted under 35 U.S.C. 154(b) by 1168 days.

(21) Appl. No.: 12/155,974

(22) Filed: Jun. 12, 2008

(65) Prior Publication Data
US 2008/0315835 A1 Dec. 25, 2008

(30) Foreign Application Priority Data
Jun. 20, 2007 (JP) ................................ 2007-163007

(51) Int. Cl.
*H02J 7/00* (2006.01)

(52) U.S. Cl.
USPC .......................................... 320/132; 320/112

(58) Field of Classification Search
USPC .......... 320/112, 120, 132, 134, 150; 429/471; 324/427, 434
See application file for complete search history.

(56) References Cited

U.S. PATENT DOCUMENTS

| 2001/0035737 A1* | 11/2001 | Nakanishi et al. | 320/122 |
| 2003/0008201 A1* | 1/2003 | Komori et al. | 429/49 |
| 2006/0012330 A1* | 1/2006 | Okumura et al. | 320/103 |

FOREIGN PATENT DOCUMENTS

JP A-2004-185915 7/2004

* cited by examiner

*Primary Examiner* — Edward Tso
*Assistant Examiner* — Aaron Piggush
(74) *Attorney, Agent, or Firm* — Oliff PLC

(57) ABSTRACT

Provided is a battery pack producing method and a battery pack capable of suppressing defects such as overcharging or overdischarging in one or more of the used secondary batteries constituting a battery pack, and sufficiently exhibiting the performance of the used secondary batteries of the battery pack. This method includes an obtaining process for obtaining each full charge capacity of the used secondary batteries, a selecting process for selecting one or more used secondary batteries having similar full charge capacities from the used secondary batteries whose full charge capacities have been obtained, and an assembling process for assembling the selected secondary batteries.

6 Claims, 9 Drawing Sheets

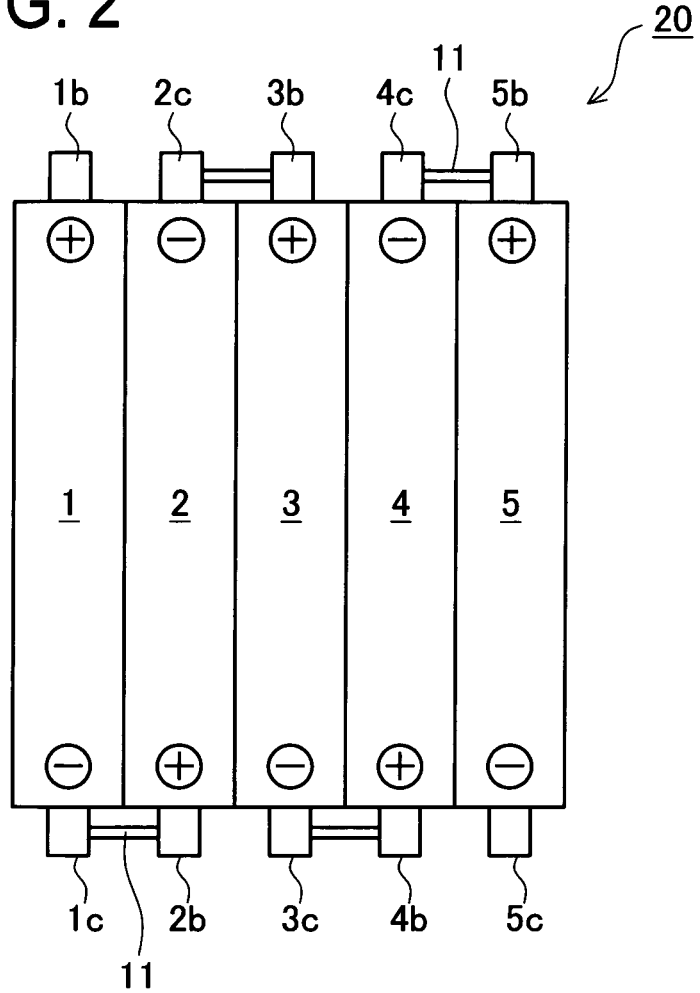

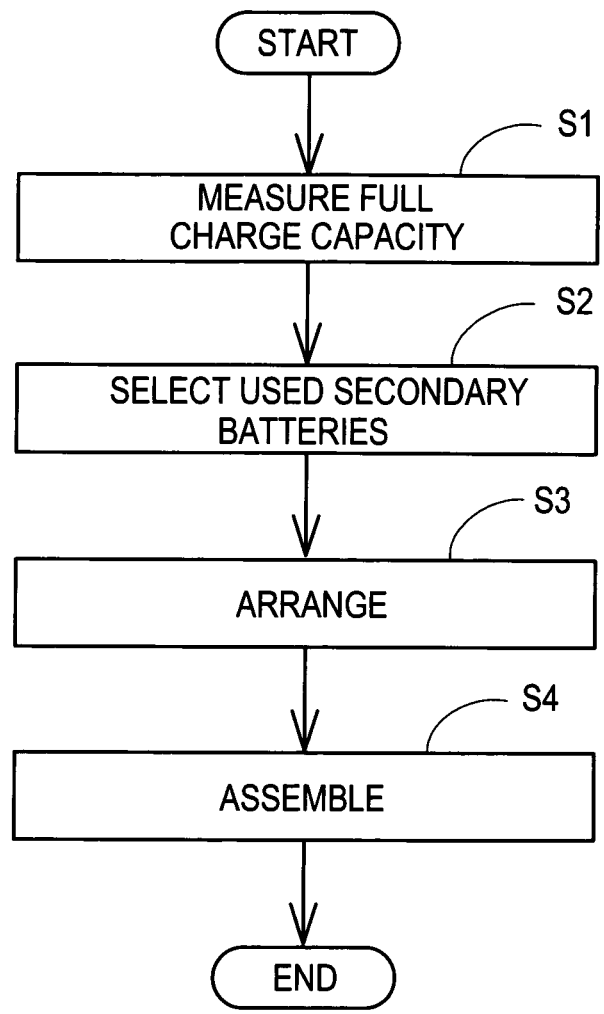

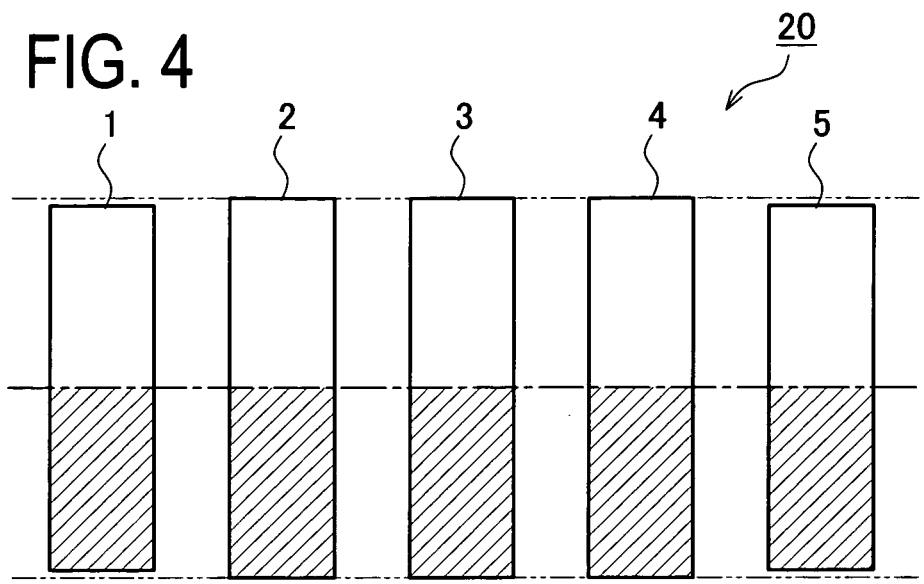
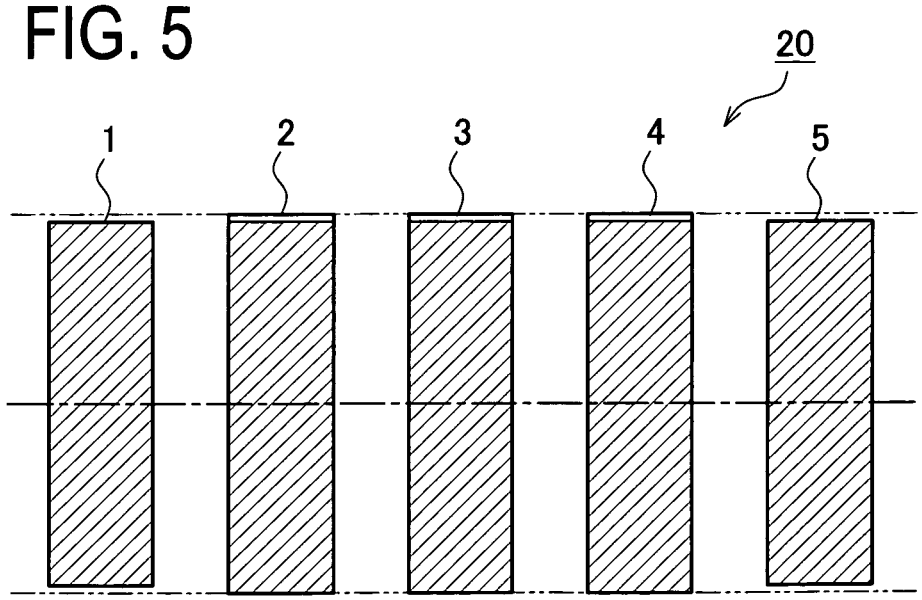

BATTERY PACK ASSEMBLED WITH RECYCLED BATTERIES AND METHOD OF ASSEMBLY

BACKGROUND OF THE INVENTION

1. Field of the Invention

The present invention relates to a battery pack producing method, and a battery pack.

2. Description of Related Art

Recently, various secondary batteries have been proposed as the power source for portable devices and mobile devices or as the power source for electric vehicles or hybrid electric vehicles. When the secondary batteries are used as the power source for electric vehicles or hybrid electric vehicles, high output power is demanded and hence a plurality of secondary batteries are electrically connected in series to be used as a battery pack.

However, in the battery pack used as the power source for electric vehicles or hybrid electric vehicles, one or more of the secondary batteries constituting the battery pack are often broken earlier than other batteries due to environments of use, characteristic difference among individual secondary batteries of the battery pack, or troubles of component parts of each secondary battery. As a result, the intended performance of the battery pack may not be exhibited, which may cause the entire system failure. To solve such problems, a secondary battery broken earlier than other batteries must be replaced with a normal secondary battery. Various methods have been proposed for replacing the secondary batteries (see, for example, JP2004-185915A).

JP2004-185915A discloses a method of replacing secondary batteries of a battery pack in which a plurality of secondary batteries are electrically connected in series or in parallel. According to this method, when a certain defective secondary battery is to be replaced with a new secondary battery for exchange, a charge amount of the new secondary battery is controlled smaller than charge amounts of other batteries not to be replaced (normal secondary batteries of the battery pack). Specifically, the new secondary battery is charged so that the charge amount thereof may be 5% to 20% smaller than the charge amounts of other normal batteries not to be replaced. As a result, according to JP'915A, when charging and discharging are repeated during use of the battery pack, the difference in charge amount (the charged electric quantity) between the new secondary battery and other existing batteries becomes smaller, and hence the charge amounts of secondary batteries of the battery pack become equal. It is also said that the performance of the battery pack can be exhibited to a maximum extent.

Even when electric vehicles or hybrid electric vehicles are to be deregistered or scrapped, the battery packs mounted thereon may still be in a usable state. Further, even in the case where the battery pack is replaced with a new battery pack due to defective one(s) of the secondary batteries of the battery pack, the other secondary batteries in the discarded battery pack may still be in a usable state. A new technique is therefore demanded for re-using the usable secondary batteries without discarding, that is, usable secondary batteries among secondary batteries used and collected from the market (hereinafter, also referred to as "used secondary battery(s)"). For example, there is a demand for a technique of producing a new battery pack by collecting used battery packs from scrapped vehicles or the like and combining usable secondary batteries (used secondary batteries) contained in those collected used battery packs.

However, the collected used secondary batteries contain those used in various environments and thus battery characteristics are often largely different from battery to battery. Such difference in battery characteristics may cause some problems when a battery pack is produced by combining the used secondary batteries. For example, one or more of the used secondary batteries constituting the battery pack may be overcharged or overdischarged and the performance of the used secondary batteries of the battery pack may not be exhibited sufficiently. JP'915A and others disclose various techniques for replacing one or more of secondary batteries constituting the battery pack (defective secondary batteries) with new and normal secondary batteries. However, such techniques could not be applied in the technique of producing a new battery pack by combining used secondary batteries.

SUMMARY OF THE INVENTION

The present invention has been made in view of the above circumstances and has an object to provide a battery pack producing method and a battery pack capable of suppressing defects such as overcharging or overdischarging in one or more of used secondary batteries constituting a battery pack, and sufficiently exhibiting the performance of the used secondary batteries of the battery pack.

To achieve the above object, the invention provides a method of producing a battery pack composed by combining a plurality of secondary batteries, the method comprising: an obtaining process for obtaining a full charge capacity of each of the secondary batteries that have already been used; a selecting process for selecting more than one used secondary batteries having similar full charge capacities from the used secondary batteries whose full charge capacities have been obtained; and an assembling process for assembling the selected used secondary batteries to constitute the battery pack.

The battery pack producing method of the invention is a method of producing a battery pack by combining used secondary batteries, and it is intended to re-use secondary batteries.

Suppose, for example, a battery pack is constituted by combining a used secondary battery of a relatively large full charge capacity and a used secondary battery of a relatively small full charge capacity. In this case, if charging and discharging are controlled based on the used secondary battery of the larger full charge capacity, the used secondary battery of the smaller full charge capacity may be overcharged or overdischarged. In particular, when the battery pack is discharged nearly to 0% SOC (state of charge) or charged nearly to 100% SOC (for example, when the battery pack is used as the power source for an electric vehicle), the used secondary battery of the smaller full charge capacity is likely to be overcharged or overdischarged. On the contrary, when the battery pack is controlled based on the used secondary battery of the smaller full charge capacity, the available electric quantity is limited to the capacity of the used secondary battery of the smaller full charge capacity, the performance of the used secondary battery of the larger full charge capacity cannot be exhibited sufficiently.

By contrast, according to the producing method of the invention, after the full charge capacity of each used secondary battery is obtained, in the selecting process, more than one used secondary batteries having similar full charge capacities are selected from the used secondary batteries whose full charge capacities have been obtained. Then the selected used secondary batteries are assembled to constitute the battery pack. Such combination of the used secondary batteries having similar full charge capacities can suppress defects such as overcharging or overdischarging in one or more of the used secondary batteries constituting the battery pack and allows the performance of the used secondary batteries of the battery pack to be exhibited sufficiently.

For example, the full charge capacity of used secondary batteries may be measured as follows. Under the constant temperature of 25° C., a used secondary battery is first discharged at a current value of 0.3 C until battery voltage becomes 1.0 V. After letting stand for 3 minutes, the used secondary battery is charged at a constant current value of 0.35 C for 3.2 hours. After letting stand for 3 minutes, the battery is discharged at a current value of 0.3 C until the battery voltage becomes 1.0 V. The discharged electric quantity at this time is defined as a full charge capacity of this secondary battery. Herein, 1 C is the current value (for example, 6.5 A) capable of completely discharging, in 1 hour, the charge amount (for example, 6.5 Ah) satisfying the nominal capacity of a used secondary battery.

The aforementioned method may cause such a disadvantage that a severely deteriorated used secondary battery is overcharged during constant current charging. Accordingly, it is preferred to prevent overcharging by making use of $\Delta T/\Delta t$ judgment. The $\Delta T/\Delta t$ judgment is a method achieved by charging a secondary battery (such as a nickel-metal hydride battery) having a property of significantly rising in battery temperature when approaching a fully charged condition, in constant current charging mode while observing the battery temperature change rate ($\Delta T/\Delta t$) per unit time, and then judging that the secondary battery is fully charged when the battery temperature change rate ($\Delta T/\Delta t$) becomes a predetermined value in an increasing direction. The constant current charging is stopped when it is determined that the secondary battery is in a fully charged state, thereby preventing overcharging.

To measure the full charge capacity, for example, a used secondary battery may be charged into a fully charged state by a constant current-constant voltage charging (CC-CV charging) technique or the like. The CC-CV charging is a technique mainly used in measurement of a full charge capacity of a lithium ion battery. This technique can prevent overcharging by charging at constant current in first half of a charging period (for example, charging for 1.6 hours at a current value of 0.35 C), and charging at constant voltage in second half of the charging period.

As the obtaining process, there are for example a way of obtaining the full charge capacity of each used secondary battery by measuring the full charge capacity of each used secondary battery and a way of knowing the full charge capacity by obtaining a used secondary battery of an already measured full charge capacity.

In the above battery pack producing method, preferably, the selecting process includes selecting the used second batteries so that a difference in full charge capacity between the used secondary battery of the largest full charge capacity and the used secondary battery of the smallest full charge capacity among the plurality of selected used secondary batteries constituting the battery pack is within 10% of the full charge capacity of the used secondary battery of the smallest full charge capacity.

In any one of the above battery pack producing methods, preferably, the assembling process includes arranging the selected used secondary batteries so that the used secondary battery having a relatively large full charge capacity is placed in a position of the battery pack where battery temperature will become relatively higher than others during use and the used secondary battery having a relatively small full charge capacity is placed in another position of the battery pack where the battery temperature will become relatively lower during use.

In the above battery pack producing method, preferably, the assembling process includes a process of arranging the selected used secondary batteries in a row to constitute the battery pack so that the used secondary battery having a smallest full charge capacity is placed at one end of the row and the used secondary battery having a second smallest full charge capacity is placed at the other end of the row.

If the selected used secondary batteries include more than one used secondary batteries having the smallest full charge capacity, any one of them may be placed at one end of a battery row in a battery pack as a used secondary battery of the smallest full charge capacity and any other one of them may be disposed at the other end of the battery row in the battery pack as a used secondary battery of a second smallest full capacity.

According to another aspect, the invention provides a battery pack comprising: a plurality of used secondary batteries combined for reuse, wherein a difference in full charge capacity between the used secondary battery of the largest full charge capacity and the used secondary battery of the smallest full charge capacity among the plurality of used secondary batteries constituting the battery pack is within 10% of the full charge capacity of the used secondary battery of the smallest full charge capacity.

The battery pack of the invention is a battery pack constituted by combining a plurality of used secondary batteries and by re-using secondary batteries.

In the battery pack of the invention, the difference in full charge capacity between the used secondary battery of the largest full charge capacity and the used secondary battery of the smallest full charge capacity among the plurality of used secondary batteries constituting the battery pack is within 10% of the full charge capacity of the used secondary battery of the smallest full charge capacity. Since used secondary batteries mutually small in difference in the full charge capacity are combined, it is effective to suppress defects due to overcharging or overdischarging in one or more of the used secondary batteries of the battery pack and also sufficiently exhibit the performance of the used secondary batteries of the battery pack.

In the above battery pack, preferably, the used secondary batteries are arranged so that the used secondary battery having a relatively large full charge capacity is placed in a position of the battery pack where battery temperature will become relatively higher (than others) during use and the used secondary battery having a relatively small full charge capacity is placed in another position of the battery pack where the battery temperature will become relatively lower during use.

In the above battery pack, preferably, the used secondary batteries are arranged in a row so that the used secondary battery having a smallest full charge capacity is placed at one end of the row and the used secondary battery having a second smallest full charge capacity is placed at the other end of the row.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings,

FIG. 2 is a top view of the battery pack in the first and second embodiments;

FIG. 3 is a flowchart showing the flow of a process of producing the battery pack in the first and second embodiments;

FIG. 4 is a schematic diagram showing charged states of used secondary batteries constituting the battery pack with SOC set to 50% in the first embodiment;

FIG. 5 is a schematic diagram showing charged states of the used secondary batteries constituting the battery pack charged until the SOC reaches 100% in the first embodiment;

DETAILED DESCRIPTION OF THE PREFERRED EMBODIMENTS

Embodiment 1

A detailed description of a first preferred embodiment of the present invention will now be given referring to the accompanying drawings.

Figure 1:
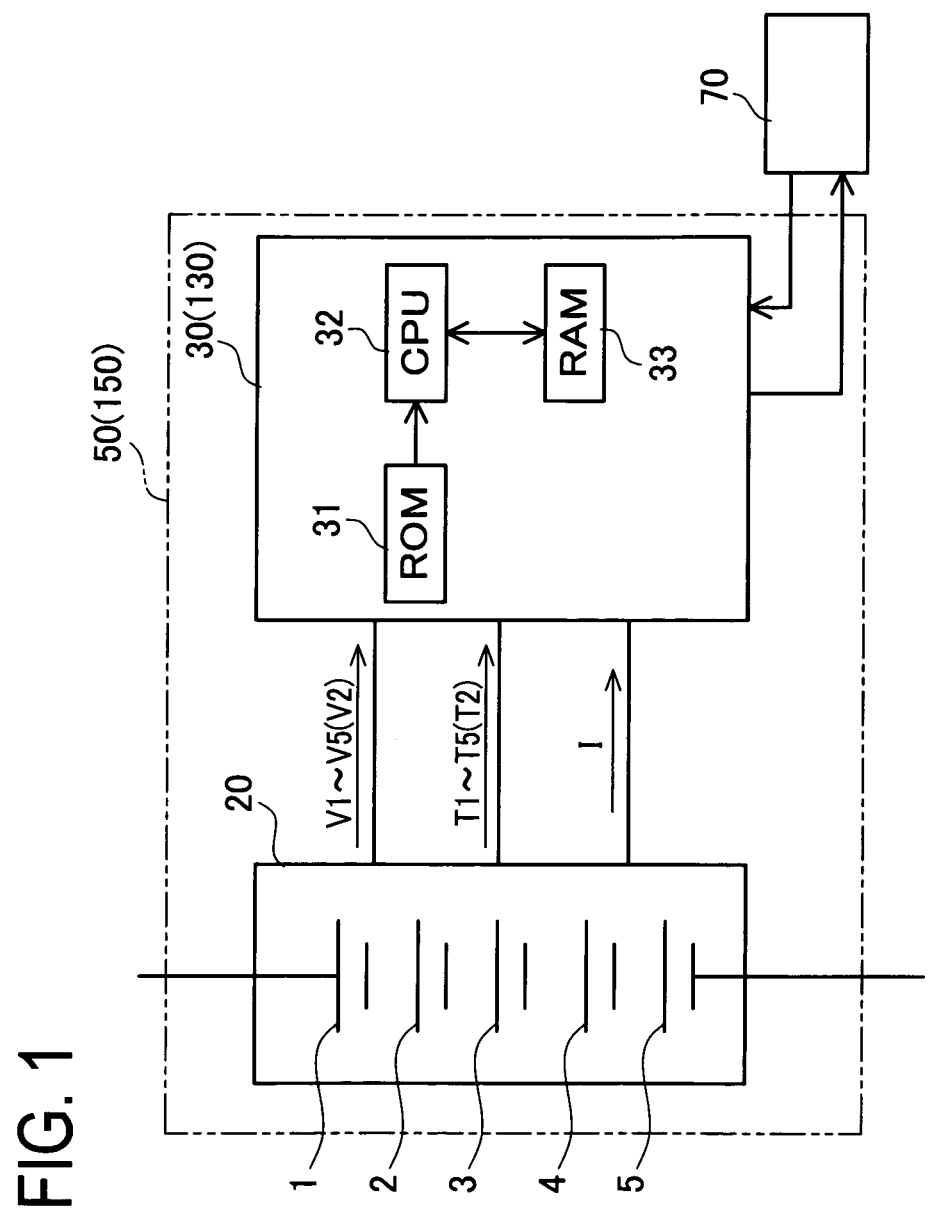
FIG. 1 is a block diagram of a battery pack with controller in first and second embodiments.

A battery pack 50 equipped with a controller (hereinafter, "controller-equipped battery pack 50") in this embodiment is first explained. The controller-equipped battery pack 50 includes, as shown in FIG. 1, a battery pack 20 and a battery controller 30. As shown in FIG. 2, the battery pack 20 includes five used secondary batteries (used secondary batteries 1 to 5) arranged in a row and electrically connected in series by way of connection members 11.

The battery controller 30 is a known battery controller (see, for example, JP2006-79961A), and includes a ROM 31, a CPU 32, a RAM 33, and others. As shown in FIG. 1, the battery controller 30 is configured to detect battery voltages V1 to V5, battery temperatures T1 to T5, and current value I of used secondary batteries 1 to 5 constituting the battery pack 20 (in the first embodiment, the used secondary batteries 1 to 5 are connected in series and hence values of currents flowing in the used secondary batteries 1 to 5 are equal). Based on these values, the storage amounts of the used secondary batteries 1 to 5 (the storage electric quantity) are estimated. Based on the obtained charge amounts (the estimated charge amounts), the SOC (state of charge) of each of the used secondary batteries 1 to 5 is estimated.

The controller-equipped battery pack 50 in the first embodiment will be mounted in for example an electric vehicle or a hybrid electric vehicle and used as the power source for these vehicles.

A producing method of the battery pack 20 in the first embodiment is described below. FIG. 3 is a flowchart showing the flow of the producing process of the battery pack 20 in the first embodiment.

(Obtaining Process)

As shown in FIG. 3, at step S1, the full charge capacities of the used secondary batteries 1 to 8 (herein, also referred to as simply "batteries") collected from the market are measured. Specifically, under the constant temperature of 25° C., the batteries 1 to 8 are discharged at a current value of 0.3 C until the battery voltage becomes 1.0 V. After letting stand for 3 minutes, the batteries 1 to 8 are charged at a constant current value of 0.35 C for 3.2 hours. After letting stand for 3 minutes, the batteries 1 to 8 are discharged at a current value of 0.3 C until the battery voltage becomes 1.0 V. The discharged electric quantity at this time is defined as the full charge capacity of each of the batteries 1 to 8. In this embodiment, 1 C is a current value (for example, 6.5 A) capable of completely discharging, in 1 hour, the storage amount (for example, 6.5 Ah) satisfying the nominal capacity of a used secondary battery. Thus, the full charge capacity of each battery 1 to 8 is obtained. The results are shown in Table 1.

In the first embodiment, this step S1 corresponds to the obtaining process.

In the above measurement of the full charge capacities of the used secondary batteries, if those batteries include a severely deteriorated used secondary battery, such battery may be overcharged during constant current charging. Accordingly, it is preferred to prevent overcharging by making use of $\Delta T/\Delta t$ judgment. The $\Delta T/\Delta t$ judgment is a method achieved by charging a secondary battery (such as a nickel-metal hydride battery) having a property of significantly rising in battery temperature when approaching a fully charged condition, in constant current charging mode while observing the battery temperature change rate ($\Delta T/\Delta t$) per unit time, and then judging that the secondary battery is fully charged when the battery temperature change rate ($\Delta T/\Delta t$) becomes a predetermined value in an increasing direction. The constant current charging is stopped when it is determined that the secondary battery is in a fully charged state, thereby preventing overcharging. In the case where nickel-metal hydride batteries are used as the used secondary batteries, the value of $\Delta T/\Delta t$ for judging the fully charged state may be preferably set at for example 0.5° C./min to 2° C./min.

TABLE 1

| Used secondary battery | Full charge capacity (Ah) |
| --- | --- |
| 1 | 4.8 |
| 2 | 5.0 |
| 3 | 5.0 |
| 4 | 5.0 |
| 5 | 4.8 |
| 6 | 3.0 |
| 7 | 3.4 |
| 8 | 3.3 |

(Selecting Process)

At step S2 (see FIG. 3), from the used secondary batteries 1 to 8 whose full charge capacities have been obtained, the batteries having similar full charge capacities are selected to the number (five batteries in the first embodiment) for constituting the battery pack 20. In the first embodiment, the used secondary batteries 1 and 5 of the full charge capacity of 4.8 Ah, and the used secondary batteries 2 to 4 of the full charge capacity of 5.0 Ah are selected.

In particular, in the first embodiment, the used secondary batteries 1 to 5 selected for constituting the battery pack 20 mutually differ by 0.2 Ah in full charge capacity between the used secondary batteries 2 to 4 of the largest full charge capacity and the used secondary batteries 1 and 5 of the smallest full charge capacity. In other words, the used secondary batteries for constituting the battery pack 20 are selected so that the difference in full charge capacity between the used secondary batteries of the largest full charge capacity (the batteries 2 to 4; 5.0 Ah) and the used secondary batteries of the smallest full charge capacity (the batteries 1 and 5; 4.8 Ah) may fall within 10% of the smallest full charge capacity (in the first embodiment, about 4.2%=(5.0-4.8)/4.8).

In the first embodiment, this step S2 corresponds to the selecting process.

(Assembling Process)

Prior to assembling the battery pack 20, the arrangement of the used secondary batteries 1 to 5 is determined at step S3. The battery pack 20 in the first embodiment is a battery pack including five used secondary batteries 1 to 5 arranged in one row as shown in FIG. 2. Accordingly, the batteries positioned at both ends of the row are more likely to be cooled as compared with the batteries placed between them. Thus, the both ends of the row of the battery pack 20 are prone to become relatively lower in battery temperature during operation and the middle of the row is apt to become relatively higher in battery temperature. The used secondary batteries positioned at both ends of the row are therefore slower in progress of deterioration by use as compared with the in-between used secondary batteries, and hence tend to be smaller in the decrease amount of the full charge capacity. In other words, the in-between used secondary batteries tend to be larger in the decrease amount of the full charge capacity by use as compared with the used secondary batteries positioned at both ends of the row.

In the first embodiment, accordingly, the selected used secondary batteries 1 to 5 were arranged so that the used secondary batteries 2 to 4 of relatively large full charge capacity were placed in the middle of the row (the position in the battery pack 20 where the battery temperature becomes relatively high during use), and the used secondary batteries 1 and 5 of relatively small full charge capacity were placed at both ends of the row (the position in the battery pack 20 where the battery temperature becomes relatively low during use). More specifically, the used secondary batteries 1 and 5 of the smallest full charge capacity among the selected used secondary batteries 1 to 5 were arranged so that the used secondary battery 1 was placed at one end of the row (the left end in FIG. 2) and the used secondary battery 5 was placed at the other end of the row of the battery pack (the right end in FIG. 2). The other used secondary batteries 2 to 4 of the large full charge capacity were placed between them. By determining the arrangement of the used secondary batteries 1 to 5 in this manner, as the deterioration of the batteries 1 to 5 progresses, the difference in the full charge capacity of the batteries 1 to 5 of the battery pack 20 is expected to be further decreased (see FIG. 7).

At step S4, successively, as shown in FIG. 2, the used secondary batteries 1 to 5 arranged as above in one row were electrically connected in series in the numerical sequence by using connection members 11 having electric conductivity. Specifically, the connections were respectively established by means of the connection members 11 between a negative electrode terminal 1c of the battery 1 and a positive electrode terminal 2b of the battery 2; between a negative electrode terminal 2c of the battery 2 and a positive electrode terminal 3b of the battery 3; between a negative electrode terminal 3c of the battery 3 and a positive electrode terminal 4b of the battery 4; and between a negative electrode terminal 4c of the battery 4 and a positive electrode terminal 5b of the battery 5. Thus, the battery pack 20 of the first embodiment was produced.

In the first embodiment, steps S3 and S4 correspond to the assembling process.

This battery pack 20 was combined with the battery controller 30 to produce the controller-equipped battery pack 50 (see FIG. 1). In the ROM 31 of the battery controller 30, the full charge capacity values of the used secondary batteries 1 to 5 are inputted in advance. Accordingly, the battery controller 30 may estimate the value of SOC in each of the used secondary batteries 1 to 5 by dividing the charge amounts of the batteries 1 to 5 estimated based on respective battery voltages V1 to V5, battery temperatures T1 to T5, and current I, by the full charge capacities of the batteries 1 to 5.

Charging and discharging control of the battery pack 20 in the first embodiment is described below.

In the first embodiment, this charging and discharging control is executed to charge or discharge the used secondary batteries 1 to 5 with reference to a state where the SOC of each battery 1 to 5 is 50% (see FIG. 4). Specifically, when a charge command is issued from a control unit 70 (see FIG. 1) that performs various controls of the electric vehicle or the like, charging of the battery pack 20 is started. In the battery pack 20 of the first embodiment in which the used secondary batteries 1 to 5 are electrically connected in series, those batteries 1 to 5 are charged respectively by an equal electric quantity. At this time, the battery controller 30 estimates the SOC of each battery 1 to 5 and detects whether any one of the used secondary batteries 1 to 5 has reached 100% SOC.

When the battery controller 30 judges that any one of the used secondary batteries 1 to 5 has reached 100% SOC, it transmits this information to the control unit 70. In response to this information, the controller 70 gives a command to forcibly stop charging of the battery pack 20. In the first embodiment, of the used secondary batteries 1 to 5 for constituting the battery pack 20, the batteries 1 and 5 have the smallest full charge capacity. Accordingly, as shown in FIG. 5, when the batteries 1 and 5 reach 100% SOC, charging of those batteries 1 to 5 is forcibly stopped. Overcharging of the batteries 1 and 5 can thus be prevented. FIG. 5 is a schematic diagram showing the charged states of the used secondary batteries 1 to 5 constituting the battery pack 20 when charged until the SOC of the batteries 1 and 5 reaches 100%.

In the first embodiment, in FIGS. 4 to 7, the full charge capacity of each of the used secondary batteries 1 to 5 is indicated by the length of a rectangular bar, and each storage amount (SOC) is shown by hatching. The same applies to a second embodiment and first and second comparative examples mentioned later as shown in FIGS. 8 to 14.

In the first embodiment, as described above, the difference in full charge capacity between the used secondary batteries of the largest full charge capacity (the batteries 2 to 4) and those of the smallest full charge capacity (the batteries 1 and 5) of the used secondary batteries 1 to 5 constituting the battery pack 20 is set within 10% of the smallest full charge capacity (about 4.2% in the first embodiment). Since the difference in full charge capacity is set small among the used secondary batteries 1 to 5, when the batteries 1 and 5 are charged up to 100% SOC as shown in FIG. 5, the other batteries 2 to 4 can also be charged nearly to 100% SOC. Specifically, when the batteries 1 and 5 are charged up to 100% SOC, the other batteries 2 to 4 can be charged to about 98% SOC.

Figure 6:
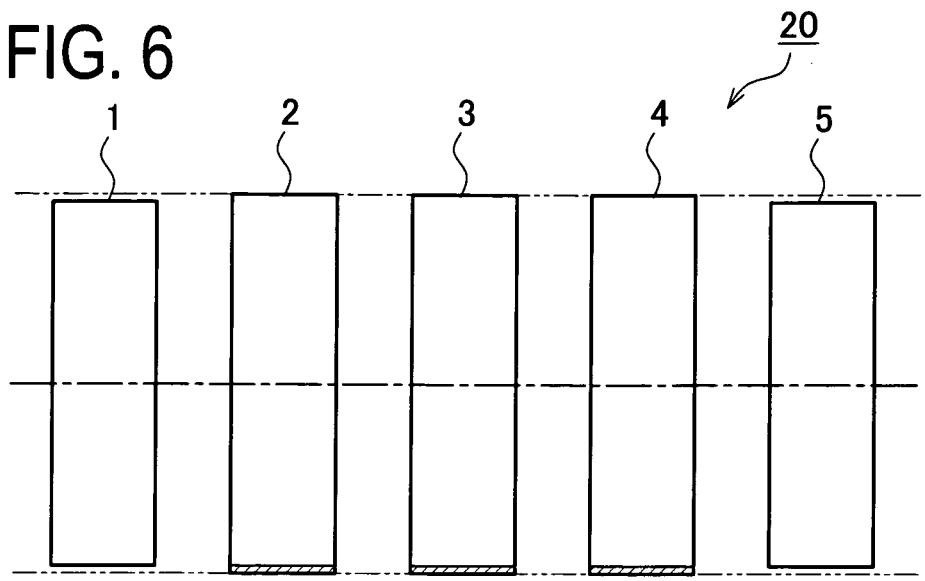
FIG. 6 is a schematic diagram showing charged states of the used secondary batteries constituting the battery pack discharged until the SOC decreases to 0% in the first embodiment.

On the other hand, when the control unit 70 issues a discharge command, discharging of the battery pack 20 is started. At this time, the battery controller 30 estimates the SOC of each of the used secondary batteries 1 to 5, and detects whether any one of the batteries 1 to 5 has decreased to 0% SOC. Then, when the battery controller 30 judges that any one of the used secondary batteries 1 to 5 has decreased to 0% SOC, it transmits this information to the control unit 70. In response to this information, the control unit 70 gives a command to forcibly stop discharging of the battery pack 20. In the first embodiment, of the used secondary batteries 1 to 5 constituting the battery pack 20, the batteries 1 and 5 have the smallest full charge capacity. Accordingly, when the batteries 1 and 5 reach 0% SOC as shown in FIG. 6, discharging of those batteries 1 to 5 is forcibly stopped. Overdischarging of the batteries 1 and 5 can thus be prevented. FIG. 6 is a schematic diagram showing the charged states of the used secondary batteries 1 to 5 of the battery pack 20 discharged until the SOC of the batteries 1 and 5 decreases to 0%.

In the first embodiment, as mentioned above, the difference in the full charge capacity among the used secondary batteries 1 to 5 is set small. When the battery pack 20 (the used secondary batteries 1 to 5) is continuously discharged until the SOC of the used secondary batteries 1 and 5 decreases to 0% as shown in FIG. 6, accordingly, the other used secondary batteries 2 to 4 can also be discharged nearly to 0% SOC. Specifically, when the discharging is continued until the SOC of the batteries 1 and 5 decreases to 0% SOC, the batteries 2 to 4 can also be discharged to about 2% SOC.

Therefore, the battery pack 20 of the first embodiment can avoid troubles of overcharging or overdischarging in one or more of the used secondary batteries 1 to 5 constituting the battery pack 20.

Further, when the used secondary batteries 1 and 5 of a small full charge capacity are charged and discharged in a range of 0% to 100% SOC, the used secondary batteries 2 to 4 of a large full charge capacity can be charged and discharged in a range of 2% to 98% SOC. That is, an electric quantity of 100% of the full charge capacity of the batteries 1 and 5 having the small full charge capacity can be used and further an electric quantity of about 96% of the full charge capacity of the batteries 2 to 4 having the large full charge capacity can be used. Hence, the battery pack 20 of the first embodiment can provide sufficient performance of each of the used secondary batteries 1 to 5 constituting the battery pack 20.

Meanwhile, since the battery pack 20 in the first embodiment is a battery pack having the five used secondary batteries 1 to 5 arranged in a row as shown in FIG. 2, the batteries 1 and 5 positioned at both ends of the row are more likely to be cooled during use as compared with the batteries 2 to 4 placed between them. Hence, the batteries 1 and 5 are slower in progress of deterioration by use as compared with the batteries 2 to 4, and the decrease amount of the full charge capacity is smaller.

Figure 7:
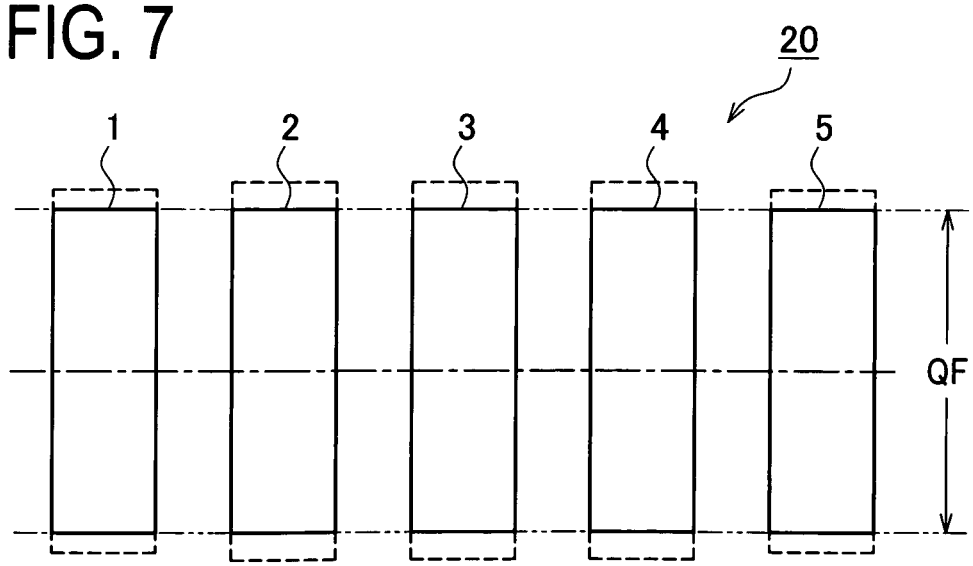
FIG. 7 is a schematic diagram showing full charge capacity of the used secondary batteries constituting the battery pack after they are deteriorated due to long-term use in the first embodiment.

In the light of this situation, in the first embodiment, the used secondary batteries 1 and 5 of the smallest full charge capacity among the used secondary batteries 1 to 5 are placed at both ends of the row of the battery pack 20, and the used secondary batteries 2 to 4 of the larger full charge capacity are placed between them. As the battery pack 20 is used, consequently, the difference in full charge capacity among the used secondary batteries 1 to 5 can further be decreased and then, as shown in FIG. 7, the full charge capacity of the used secondary batteries 1 to 5 can be adjusted equally to QF. It is therefore more effective to suppress troubles of overcharging or overdischarging of one or more of the used secondary batteries 1 to 5 constituting the battery pack 20. Moreover, the performance of each battery 1 to 5 of the battery pack 20 may be exhibited to a maximum extent.

Embodiment 2

A battery pack equipped with a controller ("controller-equipped battery pack") 150 in a second embodiment is similar to the controller-equipped battery pack 50 in the first embodiment, except the processing program (not shown) incorporated in the battery controller.

More specifically, a battery controller 130 in the second embodiment is configured to detect the battery voltage V2, battery temperature T2, and current value I of only the used secondary battery 2 out of the used secondary batteries 1 to 5 constituting the battery pack 20. Based on these values, the storage amount (the storage electric quantity) of the used secondary battery 2 is estimated. Based on the estimated charge amount, the state of charge (SOC) of the battery 2 is estimated. That is, charging and discharging of the used secondary batteries 1 to 5 are controlled based on the estimated SOC of the secondary battery 2.

Control of charging and discharging of the battery pack 20 in the second embodiment is described below.

When the control unit 70 (see FIG. 1) issues a charge command, charging of the battery pack 20 is started. At this time, the battery controller 130 estimates only the SOC of the used secondary battery 2 having the largest full charge capacity among the used secondary batteries 1 to 5, and detects whether or not the used secondary battery 2 has reached 90% SOC. When the battery controller 130 judges that the used secondary battery 2 has reached 90% SOC (see FIG. 8), it transmits this information to the control unit 70. In response to this information, the control unit 70 gives a command to forcibly stop charging of the battery pack 20.

Figure 8:
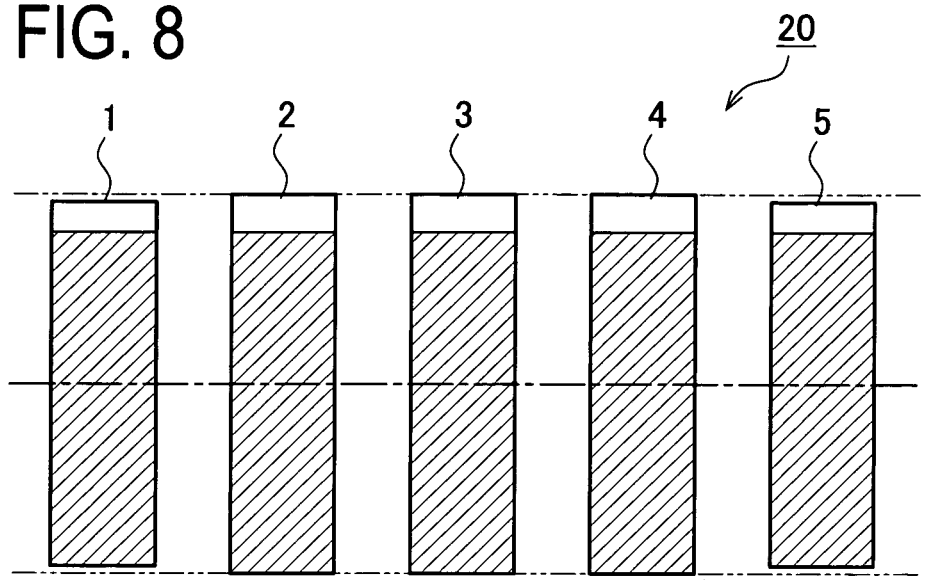
FIG. 8 is a schematic diagram showing charged states of the used secondary batteries constituting the battery pack charged until the SOC reaches 90% in the second embodiment.

FIG. 8 is a schematic diagram showing the charged states of the used secondary batteries 1 to 5 constituting the battery pack 20 when charged until the SOC of the battery 2 is increased to 90%.

In the second embodiment, as in the first embodiment, the difference in full charge capacity between the used secondary batteries of the largest full charge capacity (the batteries 2 to 4) and those of the smallest full charge capacity (the batteries 1 and 5) of the used secondary batteries 1 to 5 constituting the battery pack 20 is set within 10% of the smallest full charge capacity (about 4.2% in the second embodiment). Since the difference in full charge capacity is set small among the used secondary batteries 1 to 5, even if the battery pack 20 (the used secondary batteries 1 to 5) is charged the SOC of the battery 2 of the largest full charge capacity reaches 90% as shown in FIG. 8, the batteries 1 and 5 of the smallest full charge capacity can be prevented from being overcharged. Specifically, even when the charging is continued until the SOC of the battery 2 reaches 90%, the charging can be stopped at the time when the SOC of the batteries 1 and 5 reaches about 97%.

On the other hand, when the control unit 70 issues a discharge command, discharging of the battery pack 20 is started. At this time, the battery controller 130 estimates only the SOC of the used secondary battery 2, and detects whether or not the used secondary battery 2 has reached 10% SOC. When the battery controller 130 judges that the used secondary battery 2 has reached 10% SOC (see FIG. 9), it transmits this information to the control unit 70. The control unit 70 then gives a command to forcibly stop discharging of the battery pack 20.

Figure 9:
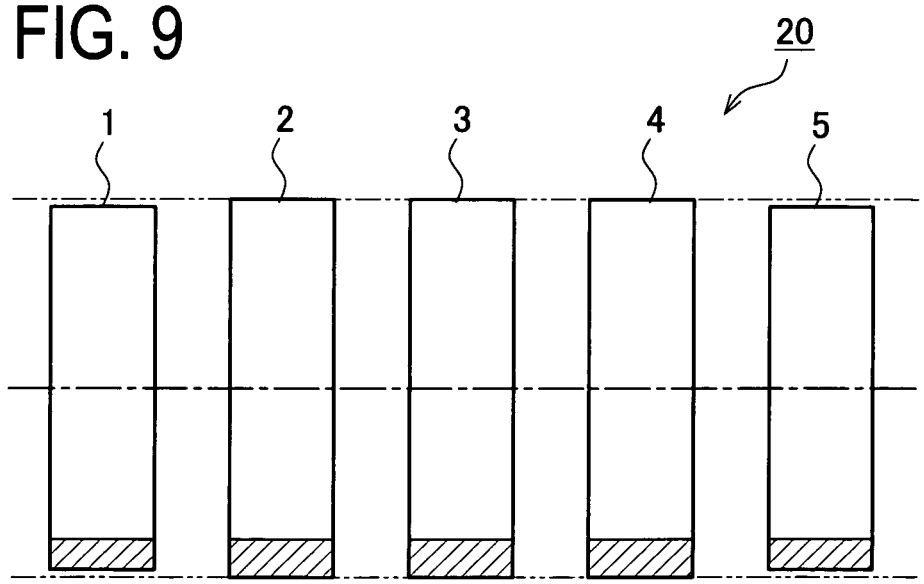
FIG. 9 is a schematic diagram showing charged states of the used secondary batteries constituting the battery pack discharged until the SOC decreases to 10% in the second embodiment.

FIG. 9 is a schematic diagram showing the charged states of the used secondary batteries 1 to 5 constituting the battery pack 20 when discharged until the SOC of the battery 2 decreases to 10%.

In the second embodiment, as mentioned above, the difference in full charge capacity among the used secondary batteries 1 to 5 is controlled small. Accordingly, even when the battery pack 20 (the used secondary batteries 1 to 5) is continuously discharged until the SOC of the used secondary battery 2 decreases to 10% as shown in FIG. 9, the batteries 1 and 5 of the smallest full charge capacity can be prevented from being overdischarged. Even when discharging is continued until the SOC of the used secondary battery 2 decreases to 10%, the discharging can be stopped at the time when the SOC of the batteries 1 and 5 decreases to about 3%.

Therefore, if charging and discharging are controlled as in the second embodiment, the use of the battery pack 20 allows avoid troubles of overcharging or overdischarging in one or more of the used secondary batteries 1 to 5 constituting the battery pack 20.

Further, when the used secondary batteries 2 to 4 of the large full charge capacity are charged and discharged in a range of 10% to 90% SOC, the used secondary batteries 1 and 5 of the small full charge capacity can be charged and discharged in a range of 3% to 97% SOC. Specifically, an electric quantity of 80% of the full charge capacity of the batteries 2 to 4 having the large full charge capacity can be used and an electric quantity of about 94% of the full charge capacity of the batteries 1 and 5 having the small full charge capacity can be used. By the use of the battery pack 20 of the second embodiment, the performance of each battery 1 to 5 constituting the battery pack 20 can be exhibited sufficiently.

Comparative Example 1

A battery pack with a controller in a first comparative example is similar to the controller-equipped battery pack 50 in the first embodiment, except that of a battery pack.

Figure 10:
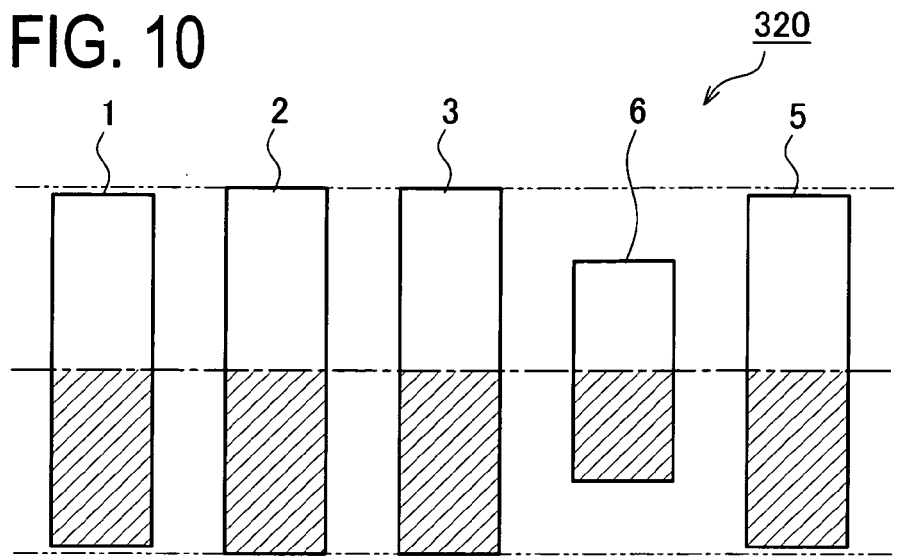
FIG. 10 is a schematic diagram showing charged states of used secondary batteries constituting a battery pack with SOC set to 50% in a first comparative example.

A battery pack 320 in the first comparative example is similar to the battery pack 20 in the first embodiment, except that the used secondary battery 4 is replaced by the used secondary battery 6 (see FIG. 10). As shown in Table 1, the used secondary battery 6 has the full charge capacity of 3.0 Ah which is relatively smaller as compared with the full charge capacities (4.8 Ah to 5.0 Ah) of the other used secondary batteries 1 to 3 and 5 constituting the battery pack 320.

Suppose the battery pack 320 in the first comparative example is charged and discharged as in the first embodiment.

Figure 11:
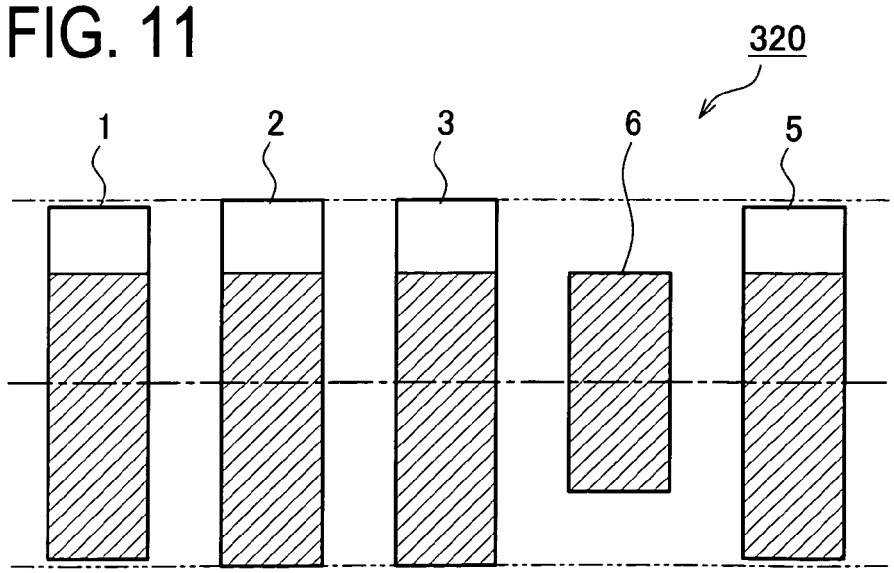
FIG. 11 is a schematic diagram showing charged states of the used secondary batteries constituting the battery pack charged until the SOC reaches 100% in the first comparative example.

When the control unit 70 (see FIG. 1) issues a charge command, charging of the battery pack 320 is started. At this time, the battery controller 30 estimates the SOC of each used secondary battery 1 to 3, 5 and 6, and detects whether any one of the batteries 1 to 3, 5 and 6 has reached 100% SOC. In the first comparative example, among the used secondary batteries 1 to 3, 5 and 6 constituting the battery pack 320, the used secondary battery 6 has the smallest full charge capacity. As shown in FIG. 11, therefore, when the used secondary battery 6 reaches 100% SOC, charging of the used secondary batteries 1 to 3, 5, and 6 is forcibly stopped. Overcharging of the used secondary battery 6 can thus be prevented. FIG. 11 is a schematic diagram showing the charged states of the used secondary batteries constituting the battery pack 320 charged until the SOC of the battery 6 reaches 100%.

In the first comparative example, however, the difference (a maximum difference) in full charge capacity between the used secondary batteries of the largest full charge capacity (the batteries 2 and 3) and the used secondary battery of the smallest full charge capacity (the battery 6) of the used secondary batteries 1 to 3, 5 and 6 constituting the battery pack 320 is 2.0 Ah, which is significantly larger as compared with 0.2 Ah in the first embodiment. Specifically, the maximum difference in full charge capacity is as large as about 67% of the full charge capacity (3.0 Ah) of the used secondary battery 6 having the smallest full charge capacity.

Accordingly, even when the charging is contoured until the SOC of the used secondary battery 6 reaches 100% as shown in FIG. 11, the batteries 1 to 3, and 5 other than the battery 6 cannot be charged sufficiently. Specifically, the used secondary batteries 2 and 3 of the largest full charge capacity can be charged only to about 80% SOC.

Figure 12:
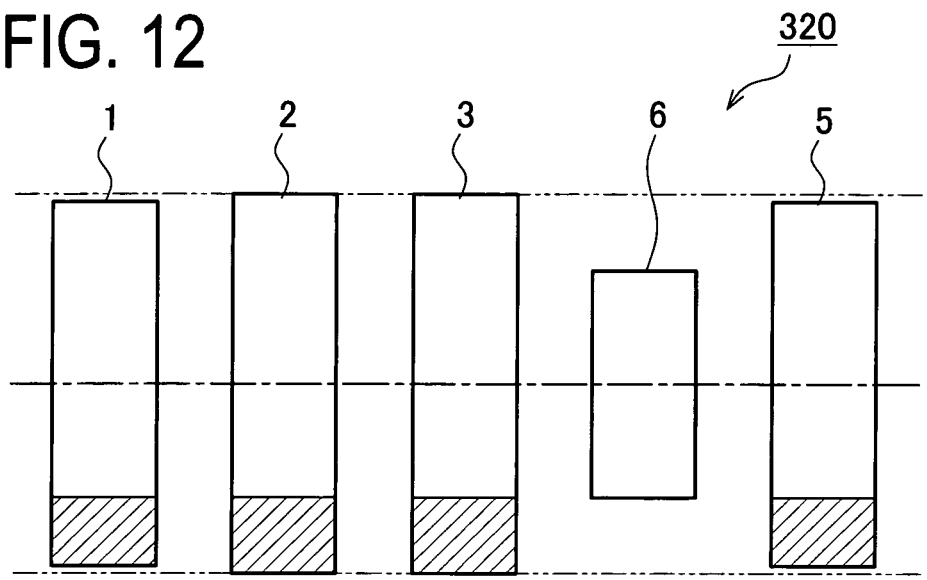
FIG. 12 is a schematic diagram showing charged states of the used secondary batteries constituting the battery pack discharged until the SOC decreases to 0% in the first comparative example.

On the other hand, when the control unit 70 issues a discharge command, discharging of the battery pack 320 is started. The battery controller 30 estimates the SOC of each used secondary battery 1 to 3, 5 and 6, and detects whether any one of the batteries 1 to 3, 5 and 6 has decreased to 0% SOC. In the first comparative example, the used secondary battery 6 has the smallest full charge capacity among the used secondary batteries 1 to 3, 5 and 6. Accordingly, when the SOC of the used secondary battery 6 decreases to 0% as shown in FIG. 12, discharging of the used secondary batteries 1 to 3, 5 and 6 is stopped forcibly. Overdischarging of the used secondary battery 6 can thus be prevented.

FIG. 12 is a schematic diagram showing the charged states of the used secondary batteries for constituting the battery pack 320 discharged until the SOC of the used secondary battery 6 decreases to 0%.

In the first comparative example, as mentioned above, the difference (the maximum difference) in full charge capacity is very large between the used secondary batteries of the largest full charge capacity (the batteries 2 and 3) and that of the smallest full charge capacity (the battery 6). Hence, even when discharging is executed until the SOC of the used secondary battery 6 decreases to 0% as shown in FIG. 12, the other used secondary batteries 1 to 3 and 5 cannot be discharged sufficiently. Specifically, the used secondary batteries 2 and 3 having the largest full charge capacity can be discharged only to about 20% SOC.

As above, the used secondary batteries 2 and 3 can be charged or discharged only in a range of 20% to 80% SOC, and the electric quantity of about 60% of the full charge capacity of the used secondary batteries 2 and 3 can be utilized. In the battery pack 320 of the first comparative example, the available electric quantity is substantially limited by the used secondary battery 6 of the small full charge capacity. Thus, the performance of the used secondary batteries 2 and 3 of the large full charge capacity cannot be exhibited sufficiently.

Comparative Example 2

A battery pack with a controller in a second comparative example is similar to the controller-equipped battery pack 150 in the second embodiment, except that the battery pack 20 is replaced by a battery pack 320.

Suppose the battery pack 320 in the second comparative example is charged and discharged as in the second embodiment.

When the control unit 70 (see FIG. 1) issues a charge command, charging of the battery pack 320 is started. At this time, the battery controller 130 estimates only the SOC of the used secondary battery 2 of the largest full charge capacity of the used secondary batteries 1 to 3, 5 and 6, and detects whether the battery 2 has reached 90% SOC. When the battery controller 130 judges that the used secondary battery 2 has reached 90% SOC (see FIG. 13), it transmits this information to the control unit 70. The control unit 70 then gives a command to forcibly stop charging of the battery pack 320.

Figure 13:
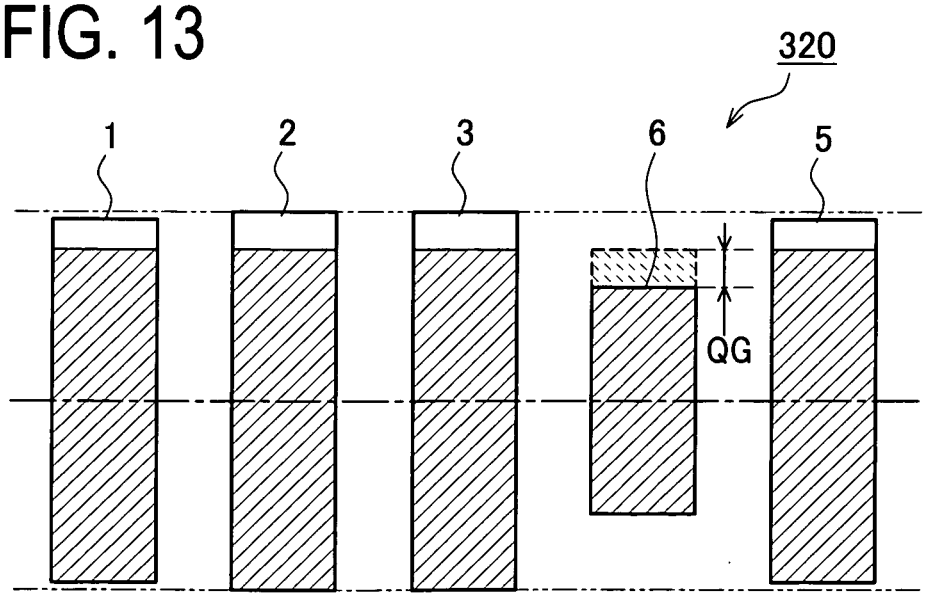
FIG. 13 is a schematic diagram showing charged states of used secondary batteries constituting a battery pack charged until the SOC reaches 90% in a second comparative example.

FIG. 13 is a schematic diagram showing the charged states of the used secondary batteries for constituting the battery pack 320 charged until the SOC of the battery 2 reaches 90%.

In the second comparative example, as in the first comparative example, however, the difference (a maximum difference) in full charge capacity is very large between the used secondary batteries of the largest full charge capacity (the batteries 2 and 3) and that of the smallest full charge capacity (the battery 6). Therefore, even when the used secondary batteries 1 to 3, 5 and 6 constituting the battery pack 320 are charged until the SOC of the used secondary batteries 2 and 3 of the largest full charge capacity reaches 90% as shown in FIG. 13, the used secondary battery 6 of the smallest full charge capacity will be overcharged. Specifically, the used secondary battery 6 of the smallest full charge capacity will be overcharged by an amount corresponding to the electric quantity QG (0.5 Ah in the second comparative example) as shown in FIG. 13. This causes undesirable conditions that the internal pressure of the used secondary battery 6 significantly increases and the battery temperature T of same largely rises.

On the other hand, when the control unit 70 issues a discharge command, discharging of the battery pack 320 is started. At this time, the battery controller 130 estimates only the SOC of the used secondary battery 2, and detects whether the battery 2 has reached 10% SOC. Then, when the battery controller 130 judges that the battery 2 has reached 10% SOC (see FIG. 14), it transmits this information to the control unit 70. The control unit 70 then gives a command to forcibly stop discharging of the battery pack 320.

Figure 14:
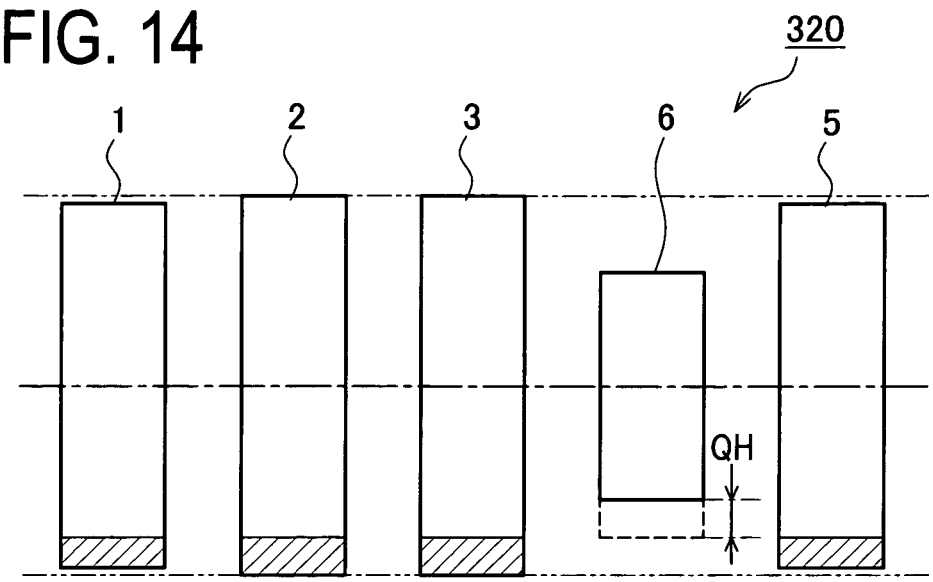
FIG. 14 is a schematic diagram showing charged states of the used secondary batteries constituting the battery pack discharged until the SOC decreases to 10% in the second comparative example.

FIG. 14 is a schematic diagram showing the charged states of the used secondary batteries constituting the battery pack 320 discharged until the SOC of the used secondary battery 2 decreases to 10%.

In the second comparative example, as mentioned above, the difference (the maximum difference) in full charge capacity is very large between the used secondary batteries of the largest full charge capacity (the batteries 2 and 3) and that of the smallest full charge capacity (the battery 6). Therefore, even when the used secondary batteries 1 to 3, 5 and 6 constituting the battery pack 320 are discharged until the batteries 2 and 3 of the largest full charge capacity reach 10% SOC as shown in FIG. 14, the battery 6 of the smallest full charge capacity is overdischarged. To be more specific, the battery 6 of the smallest full charge capacity is overdischarged by an amount corresponding to the electric quantity QH (0.5 Ah in the second comparative example) as shown in FIG. 14. This may cause a significant rise in battery internal pressure of the used secondary battery 6.

The invention is described as above along the first and second embodiments but it is not limited thereto. The invention may be embodied in other specific forms without departing from the essential characteristics thereof.

For instance, the battery pack 20 in the first and second embodiments includes five used secondary batteries (the used secondary batteries 1 to 5). However, the used secondary batteries constituting the battery pack are not limited in number if only it is more than one.

The used secondary batteries 1 to 5 are electrically connected in series to form the battery pack 20 in the first and second embodiments. The present invention can further be applied to a battery pack in which a plurality of used secondary batteries is electrically connected in parallel.

The used secondary batteries 1 to 5 are arranged in a row to constitute the battery pack 20 in the first and second embodiments. However, the arrangement of the used secondary batteries constituting the battery pack 20 may be any pattern. For instance, a plurality of used secondary batteries may be arranged in a row to form a battery row and a plurality of the battery rows may be combined to constitute a battery pack. In this case, it is preferable to arrange used secondary batteries of a relatively small full charge capacity at both ends of each battery row and used secondary batteries of a relatively large full charge capacity between them (in the middle of the row). Such arrangement can further reduce the difference in full charge capacity between the used secondary batteries constituting the battery pack as the battery pack is used. This is because the center part of each battery row tends to rise in battery temperature than the both ends during use, causing earlier deterioration of the used secondary batteries in the center part of the row than those at both ends, thus resulting in a decrease in the full charge capacity.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A method of assembling a battery pack with reused batteries that have previously been used as power sources for electric vehicles or hybrid electric vehicles, the method comprising:

measuring a full charge capacity of each of a plurality of used secondary batteries;

selecting at least two of the plurality of used secondary batteries, from which a first battery has a largest full charge capacity and a second battery has a smallest full charge capacity, so that a difference in full charge capacity between the largest full charge capacity and the smallest full charge capacity is within 10% of the smallest full charge capacity; and assembling only the selected at least two of the plurality of used secondary batteries to constitute the battery pack with only reused batteries selected by measurement of respective full charge capacity, wherein the largest full charge capacity is different from the smallest full charge capacity.

2. The method according to claim 1, wherein the assembling step further comprises:
arranging the selected at least two of the plurality of used secondary batteries so that
(i) one of the selected at least two of the plurality of used secondary batteries having a relatively large full charge capacity is placed in a first position of the battery pack and
(ii) another of the selected at least two of the plurality of used secondary batteries having a relatively small full charge capacity is placed in a second position of the battery pack, wherein
a battery temperature at the first position is higher than a battery temperature at the second position.

3. The method according to claim 1, wherein the assembling step further comprises:
selecting at least three used secondary batteries and arranging three or more of the selected at least three of the plurality of used secondary batteries in a row to constitute the battery pack so that one of the selected second battery is placed at a first end of the row, the one of the selected second battery having a smallest full charge capacity, and another of the selected at least two of the plurality of used secondary batteries having a second smallest full charge capacity is placed at a second end of the row.

4. A battery pack comprising:
a plurality of used secondary batteries combined for reuse, the used secondary batteries being previously used as power sources for electric vehicles or hybrid electric vehicles, and
the battery pack is constituted of only a plurality of used secondary batteries, wherein
a difference in full charge capacity between one of the plurality of used secondary batteries selected by measurement of respective full charge capacity, having a largest full charge capacity and another of the plurality of used secondary batteries having a smallest full charge capacity is within 10% of the smallest full charge capacity, and
the largest full charge capacity is different from the smallest full charge capacity.

5. The battery pack according to claim 4, wherein the plurality of used secondary batteries are arranged so that
(i) a first of the plurality of used secondary batteries having a relatively large full charge capacity is placed in a first position of the battery pack during use and,
(ii) a second of the plurality of used secondary batteries having a relatively small full charge capacity is placed in a second position of the battery pack during use, wherein
a battery temperature at the first position is relatively higher than a battery temperature at the second position.

6. The battery pack according to claim 4, wherein
the plurality of used secondary batteries are arranged in a row so that the another of the plurality of used secondary batteries having the smallest full charge capacity is placed at one end of the row and a second of the plurality of used secondary batteries having a second smallest full charge capacity is placed at another end of the row, wherein the used secondary batteries that constitute the battery pack are three or more.

* * * * *